(12) United States Patent
Moden et al.

(10) Patent No.: US 6,297,548 B1
(45) Date of Patent: Oct. 2, 2001

(54) STACKABLE CERAMIC FBGA FOR HIGH THERMAL APPLICATIONS

(75) Inventors: Walter L. Moden; David J. Corisis, both of Meridian; Leonard E. Mess; Larry D. Kinsman, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/344,279

(22) Filed: Jun. 30, 1999

Related U.S. Application Data
(60) Provisional application No. 60/091,205, filed on Jun. 30, 1998.

(51) Int. Cl.[7] .............................. H01L 23/02; H01L 23/22; H01L 23/34; H01L 23/12; H01L 23/48
(52) U.S. Cl. ........................ 257/686; 257/687; 257/725; 257/730; 257/731; 257/732; 257/733; 257/777
(58) Field of Search .................................. 257/686, 687, 257/725, 730, 731, 732, 733, 777

(56) References Cited

U.S. PATENT DOCUMENTS

| | | |
|---|---|---|
| 4,143,456 | 3/1979 | Inoue . |
| 4,264,917 | 4/1981 | Ugon . |
| 4,300,153 | 11/1981 | Hayakawn et al. . |
| 4,323,914 | 4/1982 | Berndlmaier et al. . |
| 4,358,552 | 11/1982 | Shinohara et al. . |
| 4,507,675 | 3/1985 | Fujii et al. . |
| 4,642,671 | 2/1987 | Rohsler et al. . |
| 4,801,998 | 1/1989 | Okuaki . |
| 4,862,245 | 8/1989 | Pashby et al. . |
| 4,931,852 | 6/1990 | Brown et al. . |
| 4,961,107 | 10/1990 | Geist et al. . |
| 4,984,059 | 1/1991 | Kubota et al. . |
| 5,051,275 | 9/1991 | Wong . |
| 5,101,465 | 3/1992 | Murphy . |
| 5,108,955 | 4/1992 | Ishida et al. . |
| 5,144,747 | 9/1992 | Eichelberger . |
| 5,173,764 | 12/1992 | Higgins, III . |
| 5,184,208 | 2/1993 | Sakuta et al. . |
| 5,194,930 | 3/1993 | Papathomas et al. . |
| 5,218,759 | 6/1993 | Juskey et al. . |
| 5,241,456 | * 8/1993 | Marcinkiewicz et al. . |
| 5,252,853 | 10/1993 | Michii . |
| 5,280,192 | * 1/1994 | Kryzaniwsky . |
| 5,286,679 | 2/1994 | Farnworth et al. . |
| 5,304,842 | 4/1994 | Farnworth et al. . |
| 5,311,060 | 5/1994 | Rostoker et al. . |
| 5,344,795 | 9/1994 | Hashemi et al. . |
| 5,379,186 | 1/1995 | Gold et al. . |
| 5,394,303 | 2/1995 | Yamaji . |
| 5,434,105 | 7/1995 | Liou . |
| 5,436,203 | 7/1995 | Lin . |
| 5,440,169 | 8/1995 | Tomita et al. . |
| 5,441,684 | 8/1995 | Lee . |
| 5,450,283 | 9/1995 | Lin et al. . |
| 5,461,255 | 10/1995 | Chan et al. . |

(List continued on next page.)

FOREIGN PATENT DOCUMENTS

| | | |
|---|---|---|
| 52-77684 | 6/1977 | (JP) . |
| 55-128835 | 10/1980 | (JP) . |
| 56-4241 | 1/1981 | (JP) . |
| 60-94744 | 5/1985 | (JP) . |
| 60-178651 | 9/1985 | (JP) . |
| 62-109326 | 5/1987 | (JP) . |
| 62-115834 | 5/1987 | (JP) . |
| 62-261133 | 11/1987 | (JP) . |
| 2-306639 | 12/1990 | (JP) . |
| 4-157758 | 5/1992 | (JP) . |

*Primary Examiner*—David E. Graybill
(74) *Attorney, Agent, or Firm*—TraskBritt

(57) ABSTRACT

An apparatus package for high temperature thermal applications for ball grid array semiconductor devices and a method of packaging ball grid array semiconductor devices.

46 Claims, 5 Drawing Sheets

U.S. PATENT DOCUMENTS

| | | |
|---|---|---|
| 5,488,254 | 1/1996 | Nishimura et al. . |
| 5,489,538 | 2/1996 | Rostoker et al. . |
| 5,489,801 | 2/1996 | Blish, II . |
| 5,552,635 | 9/1996 | Kim et al. . |
| 5,598,034 | 1/1997 | Wakefield . |
| 5,604,376 | 2/1997 | Hamburgen et al. . |
| 5,641,997 | 6/1997 | Ohta et al. . |
| 5,652,461 | 7/1997 | Ootssuki et al. . |
| 5,656,857 | 8/1997 | Kishita . |
| 5,659,952 | 8/1997 | Kovac et al. . |
| 5,754,408 * | 5/1998 | Derouiche . |
| 5,866,953 | 2/1999 | Akram et al. . |

* cited by examiner

US 6,297,548 B1

STACKABLE CERAMIC FBGA FOR HIGH THERMAL APPLICATIONS

CROSS REFERENCES TO RELATED APPLICATION

This application claims the benefit of U.S. Provisional Application No. 60/091,205 filed Jun. 30, 1998.

BACKGROUND OF THE INVENTION

1. Statement of the Invention

The present invention relates to an apparatus for high-temperature thermal applications for ball grid array semiconductor devices and a method of packaging ball grid array semiconductor devices.

2. State of the Art

Integrated semiconductor devices are typically constructed in wafer form with each device having the form of an integrated circuit die which is typically attached to a lead frame with gold wires. The die and lead frame are then encapsulated in a plastic or ceramic package, which is then commonly referred to as an integrated circuit (IC). ICs come in a variety of forms, such as a dynamic random access memory (DRAM), static random access memory (SRAM), read only memory (ROM), gate arrays, etc. The ICs are interconnected in many combinations on printed circuit boards by a number of techniques, such as socketing and soldering. Interconnection among ICs arrayed on a printed circuit board are typically made by conductive traces formed by photolithography and etching processes.

Such semiconductor devices typically take the form of the semiconductor die therein. The die is generally electrically attached to a lead frame within a package. The lead frame physically supports the die and provides electrical connections between the die and its operating environment. The die is generally electrically attached to the lead frame by means of fine gold wires. These fine gold wires function to connect the die to the lead frame so that the gold wires are connected electrically in series with the lead frame leads. The lead frame and die are then encapsulated. The packaged chip is then able to be installed on a circuit board by any desired manner, such as soldering, socketing, etc.

However, as the speed of the semiconductor die increases, the heat generated during operation increases. Additionally, it becomes necessary to shorten the leads between the printed circuit board on which the IC is located and the IC device itself in order to keep the impedance of the circuit from affecting the response speed of the IC device.

The wires connecting the leads of the lead frame to the bond pads on the active surface of the semiconductor die in an IC package are not an effective connection for high operating speed semiconductor dice as the wires slow down the response of the semiconductor die.

Therefore, a packaging is required for semiconductor dice which have high operating speeds and generate heat associated therewith while minimizing the lead length between the semiconductor dice and the printed circuit boards on which they are mounted.

SUMMARY OF THE INVENTION

The present invention comprises an apparatus package for high temperature thermal applications for ball grid array semiconductor devices and a method of packaging ball grid array semiconductor devices.

The present invention will be better understood when the drawings are taken in conjunction with the description of the invention.

DESCRIPTION OF THE INVENTION

Figure 1:
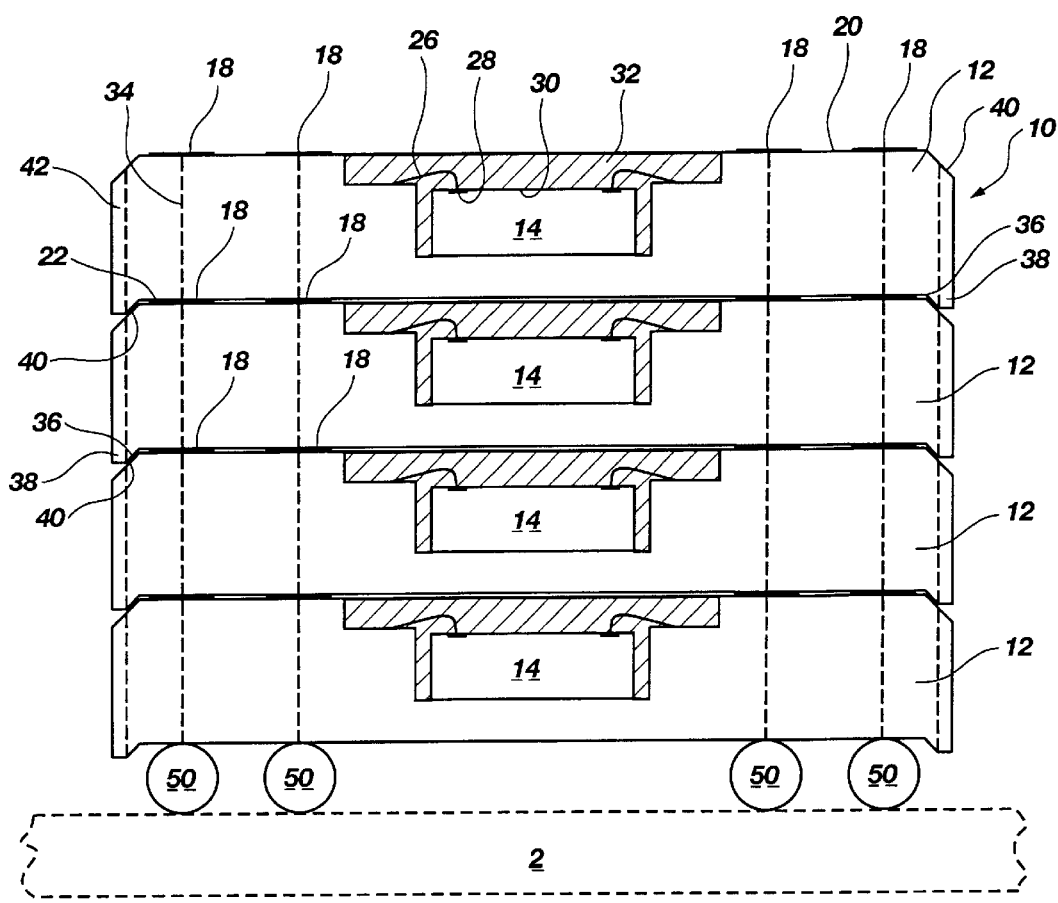
FIG. 1 is a cross-sectional view of a stack of a first embodiment of the packaged semiconductor dice of the present invention on a printed circuit board.

Referring to drawing FIG. 1, a plurality of assemblies 10 comprising a carrier 12 and a semiconductor device 14 located therein is illustrated installed on a substrate 2. Each carrier 12 comprises a member having a cavity 16 therein. As illustrated, the cavity 16 may be a single level or multi-level cavity having any desired number of levels therein. The carrier 12 is formed having a plurality of contact pads 18 located on the upper surface 20 and lower surface 22 thereof which is connected by circuits 24 (not shown) and by wire bonds 26 to the bond pads 28 located on the active surface 30 of the semiconductor die or device 14. The semiconductor die or device 14 is initially retained within the cavity 16 by any suitable means, such as adhesive, etc. The circuits 24 (not shown) are formed on the upper surface 20 of the carrier 12 and portions of the walls or surfaces of the cavity 16 by any suitable well known means, such as deposition and etching processes. The wire bonds connecting the bond pads 28 of the semiconductor die or device 14 to the circuits 24 (not shown) are made using any suitable commercially available wire bonder. After the wire bonds 26 are formed, the cavity 16 is filled with suitable encapsulant material 32 covering and sealing the semiconductor die 14 in the cavity 16 and sealing the wire bond 26 in position therein.

The carriers 12 may be of any desired geometric shape. The carrier 12 is formed having internal circuits 34 extending between the contact pads 18 on the upper surface 20 and lower surface 22 of the carrier 12. The carrier 12 is formed having frusticonical recess surfaces 36, lips 38, and frusticonical surfaces 40 on the upper surface 20. The surfaces 36 and 40 are formed having complementary angles so that the surfaces 36 and lips 38 of an adjacent carrier 12 mate or nest with an adjacent carrier 12 having surfaces 40 thereon thereby forming a stable, self-aligning stack of carriers 12. If desired, the carriers 12 may be formed having a plurality of heat transfer fins 42 thereon. The carrier 12 may be formed of any desired suitable material, such as ceramic material, high-temperature plastic material, etc. The carrier 12 may be formed by any suitable method, such as molding, extrusion, etc.

Once a plurality of carriers 12 having semiconductor die or devices it therein is formed as an assembly, the assembly is connected to the substrate 2 using a plurality of reflowed solder balls 50. The substrate 2 includes circuitry thereon, on either the upper surface or lower surface or both, and therein, as well as conductive vias, if desired. The substrate 2 may be any suitable substrate, such as a printed circuit board, FR-4 board, etc. Any desired number of carriers 12 may be stacked to form an assembly on the substrate 2. As illustrated, the reflowed solder balls 50 are located in alignment with the contact pads 18 and the connecting internal circuits 34 extending between the contact pads 18 on the upper surface 20 and lower surface 22 of a carrier 12.

Figure 2:
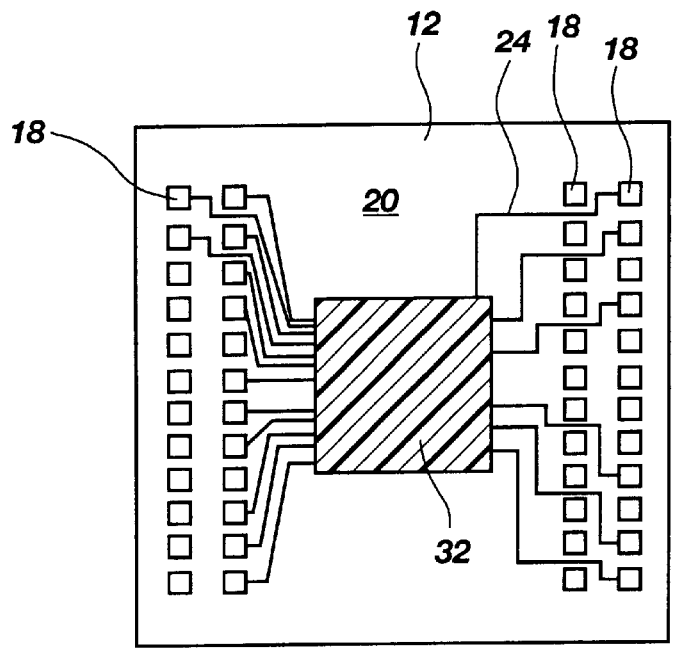
FIG. 2 is a top view of a packaged semiconductor die of the present invention.

Referring to drawing FIG. 2, a carrier 12 having circuits 24 thereon extending between contact pads 18 on the upper surface 20 of the carrier 12 is illustrated. For purposes of clarity, only a portion of the circuits 24 extending on the surface 20 of the carrier 12 is illustrated.

Figure 3:
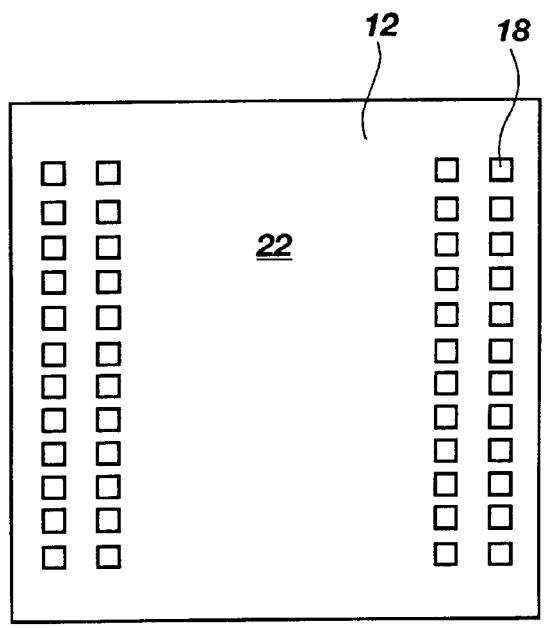
FIG. 3 is a bottom view of a packaged semiconductor die of the present invention.

Referring to drawing FIG. 3, the bottom surface 22 of a carrier 12 is illustrated having a plurality of contact pads 18 located thereon.

Figure 4:
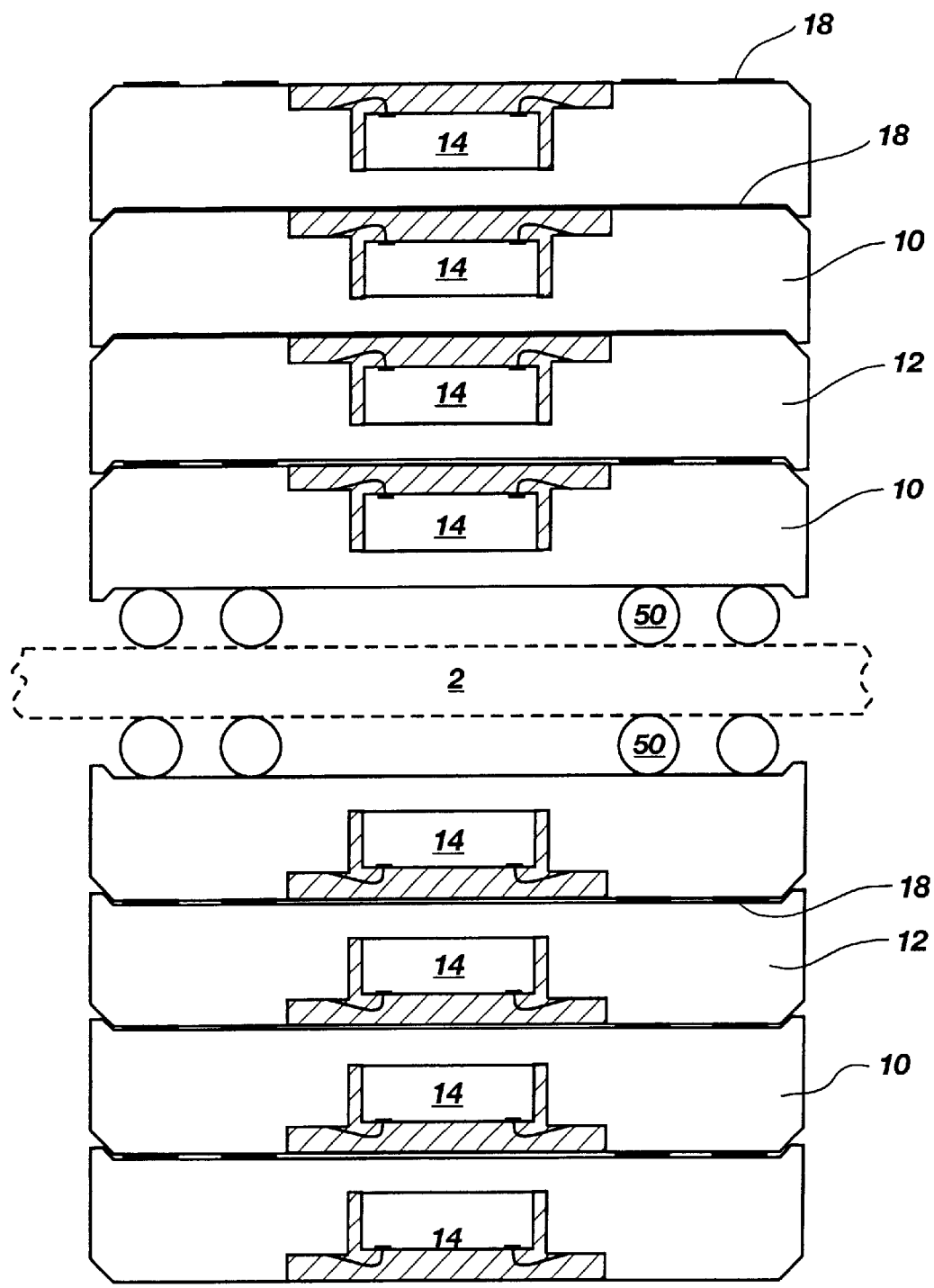
FIG. 4 is a cross sectional view of stacks of the packaged semiconductor dice of the present invention on both sides of a printed circuit board.

Referring to drawing FIG. 4, a plurality of assemblies 10 is illustrated located on both sides of a substrate 2 being connected to the circuitry thereon by a plurality of reflowed solder balls 50.

Figure 5:
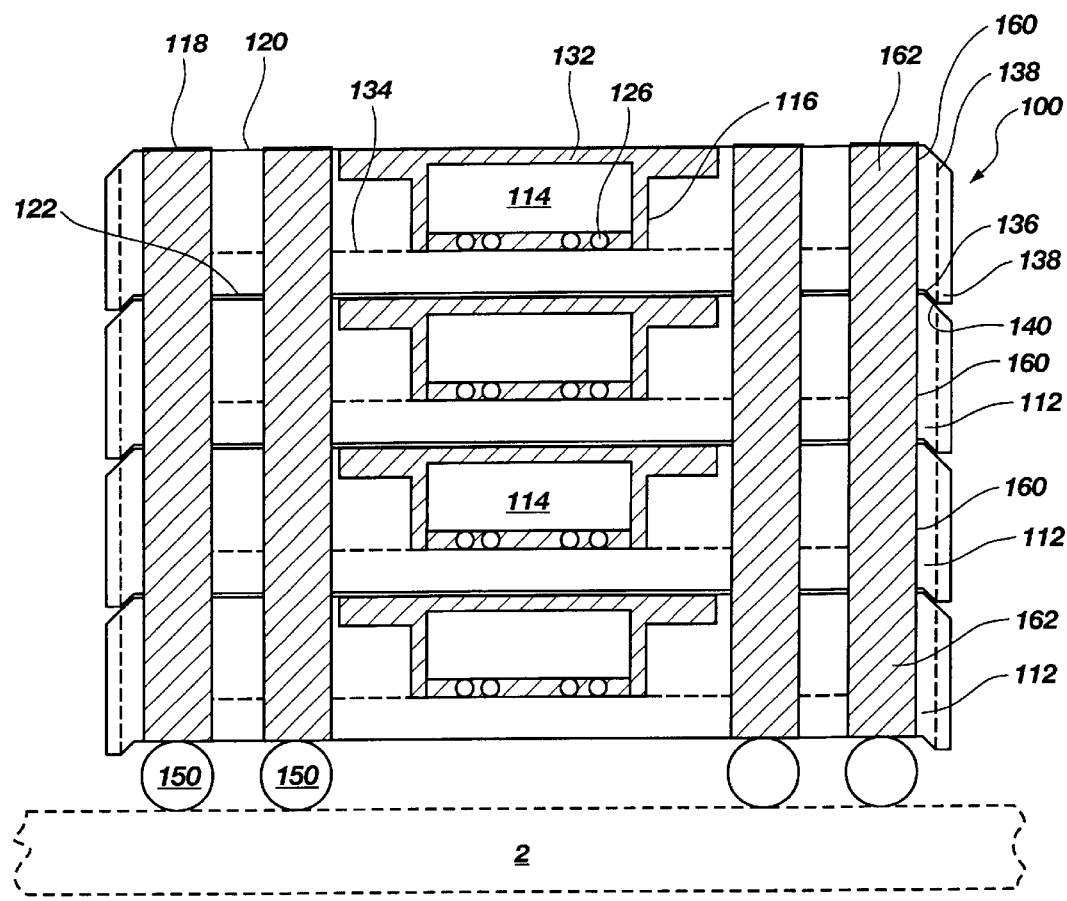
FIG. 5 is a cross sectional view of a stack of a second embodiment of the packaged semiconductor die of the present invention on a printed circuit board.

Referring to drawing FIG. 5, a second embodiment of the present invention is illustrated. A plurality of assemblies 100 is stacked on a substrate 2, being electrically and mechanically connected thereto by reflowed solder balls 150. Each assembly 100 comprises a carrier 112 having a cavity 116 therein containing a semiconductor die or device 114 therein. The semiconductor die or device 114 is electrically connected to the circuits 134 of the carrier 112 by reflowed solder balls 126. Each carrier 112 is formed having apertures 160 therethrough connecting with circuits 134. Each carrier 112 is formed with surfaces 136 and 140 as well as lips 138 as described hereinbefore with respect to carrier 112. To connect each carrier 112 to an adjacent carrier 112 a conductive material 162, such as conductive epoxy, solder, etc., is used to fill the apertures 160 in the carriers and contact the conductive material 162 in adjacent carriers 112.

The carriers 112 are similar in construction to the carriers 12 as described hereinbefore, except for the apertures 160, conductive material 162, circuits 134, and reflowed solder balls 126 between the semiconductor die or device 114 and the circuits 134.

The substrate 2 is the same as described hereinbefore.

Figure 6:
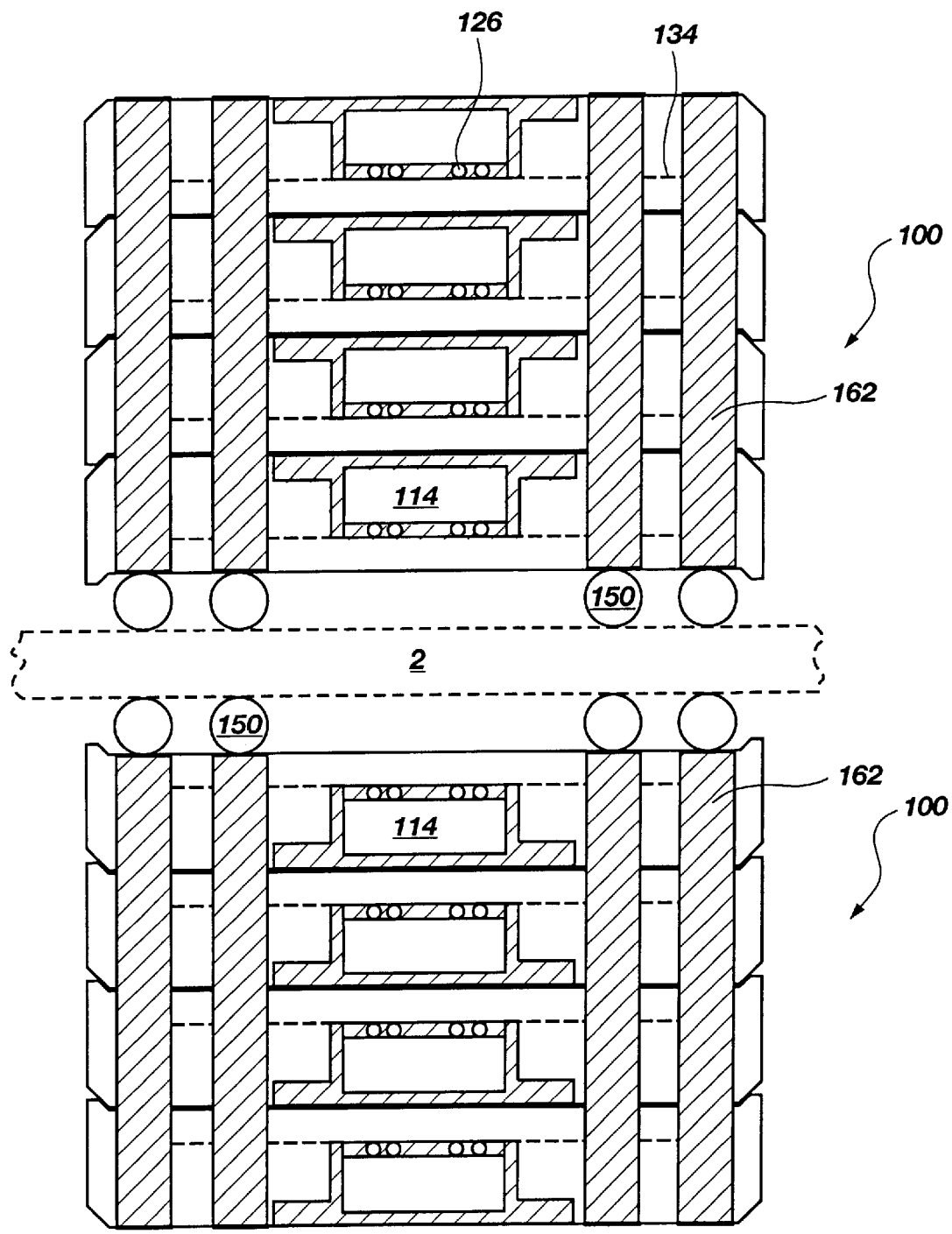
FIG. 6 is a cross sectional view of stack of the second embodiment of the present invention on both sides of a print circuit board.

Referring to drawing FIG. 6, a plurality of assemblies 100 are illustrated stacked on both sides of a substrate 2, being electrically and mechanically connected thereto by reflowed solder balls 150.

The present invention includes additions, deletions, modifications, and alterations which are within the scope of the claims.

What is claimed is:

1. An assembly comprising:
   a first carrier having a cavity therein, an upper surface, a lower surface, at least one connection pad on the upper surface, at least one connection pad on the lower surface, a first circuit connecting the at least one connection pad on the upper surface to the at least one connection pad on the lower surface, and at least one second circuit located in a portion of the cavity connected to the at least one connection pad on the upper surface and the at least one connection pad on the lower surface;
   a semiconductor device having an active surface having at least one bond pad thereon, the semiconductor device located within the cavity of the first carrier;
   a first connector between the at least one second circuit located in a portion of the cavity of the first carrier and the at least one bond pad on the active surface of the semiconductor device; and
   encapsulant material filling a portion of the cavity in the first carrier.

2. The assembly of claim 1, further comprising:
   a substrate having an upper surface, a lower surface, and at least one circuit on the upper surface thereof; and
   at least one second connector connected to the at least one connection pad on the lower surface of the first carrier and the at least one circuit on the upper surface of the substrate.

3. The assembly of claim 1, wherein the first carrier includes at least one fin on a portion thereof.

4. The assembly of claim 1, further comprising:
   a second carrier oriented with respect to the first carrier and positioned the same direction as the first carrier further having a cavity therein, an upper surface, a lower surface, at least one connection pad on the upper surface, at least one connection pad on the lower surface, at least one first circuit connecting the at least one connection pad on the upper surface to the at least one connection pad on the lower surface, and at least one second circuit located in a portion of the cavity connected to the at least one connection pad on the upper surface and the at least one connection pad on the lower surface;
   a semiconductor device having an active surface having at least one bond pad thereon, the semiconductor device located within the cavity of the second carrier;
   a first connector between the at least one second circuit located in a portion of the cavity of the first carrier and the at least one bond pad on the active surface of the semiconductor device; and
   encapsulant material filling a portion of the cavity in the first carrier.

5. The assembly of claim 1, wherein the first carrier includes a first frustoconical surface on a portion thereof, a second frustoconical surface on another portion thereof, and a lip on a portion of a bottom surface thereof.

6. An assembly comprising:
   a first carrier having a cavity therein, an upper surface, a lower surface, at least one aperture extending therethrough, and at least one circuit located in a portion of the cavity extending to the at least one aperture;
   a semiconductor device having an active surface having at least one bond pad thereon, the semiconductor device located within the cavity of the first carrier;
   a first connector between the at least one circuit located in a portion of the cavity of the first carrier and the at least one bond pad on the active surface of the semiconductor device;
   encapsulant material filling a portion of the cavity in the first carrier; and
   connector material located in the at least one aperture in the first carrier.

7. The assembly of claim 6, further comprising:
   a substrate having an upper surface, a lower surface, and at least one circuit on the upper surface thereof; and
   at least one second connector connected to the connector material in the at least one aperture in the first carrier and the at least one circuit on the upper surface of the substrate.

8. The assembly of claim 6, wherein the first carrier includes at least one fin on a portion thereof.

9. The assembly of claim 6, further comprising:
   a second carrier oriented with respect to the first carrier and positioned the same direction as the first carrier further having a cavity therein, an upper surface, a lower surface, at least one aperture therethrough, and at least one circuit located in a portion of the cavity connected to the at least one aperture;

a semiconductor device having an active surface having at least one bond pad thereon, the semiconductor device located within the cavity of the second carrier;

a first connector between the at least one circuit located in a portion of the cavity of the first carrier and the at least one bond pad on the active surface of the semiconductor device;

encapsulant material filling a portion of the cavity in the first carrier; and connector material located in a second aperture in the second carrier connected to the connector material in the at least one aperture in the first carrier.

10. The assembly of claim 6, wherein the first carrier includes a first frustoconical surface on a portion thereof, a second frustoconical surface on another portion thereof, and a lip on a portion of a bottom surface thereof.

11. A semiconductor device assembly comprising:

a first carrier having a cavity therein, an upper surface, a lower surface, at least one connection pad on the upper surface, at least one connection pad on the lower surface, a first circuit connecting the at least one connection pad on the upper surface to the at least one connection pad on the lower surface, and at least one second circuit located in a portion of the cavity connected to the at least one connection pad on the upper surface and the at least one connection pad on the lower surface;

a semiconductor device having an active surface having at least one bond pad thereon, the semiconductor device located within the cavity of the first carrier;

a first connector between the at least one second circuit located in a portion of the cavity of the first carrier and the at least one bond pad on the active surface of the semiconductor device; and encapsulant material filling a portion of the cavity in the first carrier.

12. The semiconductor device assembly of claim 11, further comprising: a substrate having an upper surface, a lower surface, and the at least one second circuit on the upper surface thereof; and at least one second connector connected to the at least one connection pad on the lower surface of the first carrier and the at least one second circuit on the upper surface of the substrate.

13. The semiconductor device assembly of claim 11, wherein the first carrier includes at least one fin on a portion thereof.

14. The semiconductor device assembly of claim 11, further comprising:

a second carrier oriented with respect to the first carrier and positioned the same direction as the first carrier further having a cavity therein, an upper surface, a lower surface, at least one connection pad on the upper surface, at least one connection pad on the lower surface, a first circuit connecting the at least one connection pad on the upper surface to the at least one connection pad on the lower surface, and at least one second circuit located in a portion of the cavity connected to the at least one connection pad on the upper surface and the at least one connection pad on the lower surface;

a semiconductor device having an active surface having at least one bond pad thereon, the semiconductor device located within the cavity of the second carrier;

a first connector between the at least one second circuit located in a portion of the cavity of the first carrier and the at least one bond pad on the active surface of the semiconductor device; and encapsulant material filling a portion of the cavity in the first carrier.

15. The semiconductor device assembly of claim 11, wherein the first carrier includes a first frustoconical surface on a portion thereof, a second frustoconical surface on another portion thereof, and a lip on a portion of a bottom surface thereof.

16. A semiconductor device assembly comprising:

a first carrier having a cavity therein, an upper surface, a lower surface, at least one aperture extending therethrough, and at least one circuit located in a portion of the cavity extending to the at least one aperture;

a semiconductor device having an active surface having at least one bond pad thereon, the semiconductor device located within the cavity of the first carrier;

a first connector between the at least one circuit located in a portion of the cavity of the first carrier and the at least one bond pad on the active surface of the semiconductor device;

encapsulant material filling a portion of the cavity in the first carrier; and connector material located in the at least one aperture in the first carrier.

17. The semiconductor assembly of claim 16, further comprising:

a substrate having an upper surface, a lower surface, and at least one circuit on the upper surface thereof; and at least one second connector connected to the connector material in the at least one aperture in the first carrier and the at least one circuit on the upper surface of the substrate.

18. The semiconductor device assembly of claim 16, wherein the first carrier includes at least one fin on a portion thereof.

19. The semiconductor device assembly of claim 16, further comprising:

a second carrier oriented with respect to the first carrier and positioned the same direction as the first carrier further having a cavity therein, an upper surface, a lower surface, at least one aperture therethrough, and at least one circuit located in a portion of the cavity connected to the at least one aperture;

a semiconductor device having an active surface having at least one bond pad thereon, the semiconductor device located within the cavity of the second carrier;

a first connector between the at least one circuit located in a portion of the cavity of the first carrier and the at least one bond pad on the active surface of the semiconductor device;

encapsulant material filling a portion of the cavity in the first carrier; and connector material located in a second aperture in the second carrier connected to the connector material in the at least one aperture in the first carrier.

20. The semiconductor device assembly of claim 16, wherein the first carrier includes a first frustoconical surface on a portion thereof, a second frustoconical surface on another portion thereof, and a lip on a portion of a bottom surface thereof.

21. An assembly comprising:
    a substrate having an upper surface, a lower surface, and at least one circuit on the upper surface thereof,
    a first carrier having a cavity therein, an upper surface, a lower surface, at least one connection pad on the upper surface, at least one connection pad on the lower surface, at least one first circuit connecting the at least one connection pad on the upper surface to the at least one connection pad on the lower surface, and at least one second circuit located in a portion of the cavity connected to the at least one connection pad on the upper surface and the at least one connection pad on the lower surface;
    a semiconductor device having an active surface having at least one bond pad thereon, the semiconductor device located within the cavity of the first carrier;
    a first connector between the at least one second circuit located in a portion of the cavity of the first carrier and the at least one bond pad on the active surface of the semiconductor device;
    encapsulant material filling a portion of the cavity in the first carrier; and
    at least one second connector connected to the at least one connection pad on the lower surface of the first carrier and the at least one first circuit on the upper surface of the substrate.

22. The assembly of claim 21, wherein the first carrier includes at least one fin on a portion thereof.

23. The assembly of claim 21, further comprising:
    a second carrier oriented with respect to the first carrier and positioned the same direction as the first carrier further having a cavity therein, an upper surface, a lower surface, at least one connection pad on the upper surface, at least one connection pad on the lower surface, a first circuit connecting the at least one connection pad on the upper surface to the at least one connection pad on the lower surface, and at least one second circuit located in a portion of the cavity connected to the at least one connection pad on the upper surface and the at least one connection pad on the lower surface;
    a semiconductor device having an active surface having at least one bond pad thereon, the semiconductor device located within the cavity of the second carrier;
    a first connector between the at least one second circuit located in a portion of the cavity of the first carrier and the at least one bond pad on the active surface of the semiconductor device; and
    encapsulant material filling a portion of the cavity in the first carrier.

24. The assembly of claim 21, wherein the first carrier includes a first frustoconical surface on a portion thereof, a second frustoconical surface on another portion thereof, and a lip on a portion of a bottom surface thereof.

25. An assembly comprising:
    a substrate having an upper surface, a lower surface, and at least one circuit on the upper surface thereof;
    a first carrier having a cavity therein, an upper surface, a lower surface, at least one aperture extending therethrough, and at least one circuit located in a portion of the cavity extending to the at least one aperture;
    a semiconductor device having an active surface having at least one bond pad thereon, the semiconductor device located within the cavity of the first carrier;
    a first connector between the at least one circuit located in a portion of the cavity of the first carrier and the at least one bond pad on the active surface of the semiconductor device;
    encapsulant material filling a portion of the cavity in the first carrier;
    connector material located in the at least one aperture in the carrier; and
    at least one second connector connected to the connector material in the at least one aperture in the first carrier and the at least one circuit on the upper surface of the substrate.

26. The assembly of claim 25, wherein the first carrier includes at least one fin on a portion thereof.

27. The assembly of claim 25, further comprising:
    a second carrier oriented with respect to the first carrier and positioned the same direction as the first carrier further having a cavity therein, an upper surface, a lower surface, at least one aperture therethrough, and at least one circuit located in a portion of the cavity connected to the at least one aperture;
    a semiconductor device having an active surface having at least one bond pad thereon, the semiconductor device located within the cavity of the second carrier;
    a first connector between the at least one circuit located in a portion of the cavity of the first carrier and the at least one bond pad on the active surface of the semiconductor device;
    encapsulant material filling a portion of the cavity in the first carrier; and
    connector material located in a second aperture in the second carrier connected to the connector material in the at least one aperture in the first carrier.

28. The assembly of claim 25, wherein the first carrier includes a first frustoconical surface on a portion thereof, a second frustoconical surface on another portion thereof, and a lip on a portion of the bottom surface thereof.

29. A semiconductor device assembly comprising:
    a substrate having an upper surface, a lower surface, and at least one circuit on the upper surface thereof;
    a first carrier having a cavity therein, an upper surface, a lower surface, at least one connection pad on the upper surface, at least one connection pad on the lower surface, at least one first circuit connecting the at least one connection pad on the upper surface to the at least one connection pad on the lower surface, and at least one second circuit located in a portion of the cavity connected to the at least one connection pad on the upper surface and the at least one connection pad on the lower surface;
    a semiconductor device having an active surface having at least one bond pad thereon, the semiconductor device located within the cavity of the first carrier;
    a first connector between the at least one second circuit located in a portion of the cavity of the first carrier and the at least one bond pad on the active surface of the semiconductor device;
    encapsulant material filling a portion of the cavity in the first carrier; and
    at least one second connector connected to the at least one connection pad on the lower surface of the first carrier and the at least one first circuit on the upper surface of the substrate.

30. The semiconductor device assembly of claim 29, wherein the first carrier includes at least one fm on a portion thereof.

31. The semiconductor device assembly of claim 29, further comprising:
- a second carrier oriented with respect to the first carrier and positioned the same direction as the first carrier further having a cavity therein, an upper surface, a lower surface, at least one connection pad on the upper surface, at least one connection pad on the lower surface, a first circuit connecting the at least one connection pad on the upper surface to the at least one connection pad on the lower surface, and at least one second circuit located in a portion of the cavity connected to the at least one connection pad on the upper surface and the at least one connection pad on the lower surface;
- a semiconductor device having an active surface having at least one bond pad thereon, the semiconductor device located within the cavity of the second carrier;
- a first connector between the at least one second circuit located in a portion of the cavity of the first carrier and the at least one bond pad on the active surface of the semiconductor device; and
- encapsulant material filling a portion of the cavity in the first carrier.

32. The semiconductor device assembly of claim 29, wherein the first carrier includes a first frustoconical surface on a portion thereof, a second frustoconical surface on another portion thereof, and a lip on a portion of a bottom surface thereof.

33. A semiconductor device assembly comprising:
- a substrate having an upper surface, a lower surface, and at least one first circuit on the upper surface thereof;
- a first carrier having a cavity therein, an upper surface, a lower surface, at least one aperture extending therethrough, and at least one second circuit located in a portion of the cavity extending to the at least one aperture;
- a semiconductor device having an active surface having at least one bond pad thereon, the semiconductor device located within the cavity of the first carrier;
- a first connector between the at least one second circuit located in a portion of the cavity of the first carrier and the at least one bond pad on the active surface of the semiconductor device;
- encapsulant material filling a portion of the cavity in the first carrier;
- connector material located in the at least one aperture in the carrier; and
- at least one second connector connected to the connector material in the at least one aperture in the first carrier and the at least one first circuit on the upper surface of the substrate.

34. The semiconductor device assembly of claim 33, wherein the first carrier includes at least one fin on a portion thereof.

35. The semiconductor device assembly of claim 33, further comprising:
- a second carrier oriented with respect to the first carrier and positioned the same direction as the first carrier further having a cavity therein, an upper surface, a lower surface, at least one aperture therethrough, and at least one circuit located in a portion of the cavity connected to the at least one aperture;
- a semiconductor device having an active surface having at least one bond pad thereon, the semiconductor device located within the cavity of the second carrier;
- a first connector between the at least one circuit located in a portion of the cavity of the first carrier and the at least one bond pad on the active surface of the semiconductor device;
- encapsulant material filling a portion of the cavity in the first carrier; and
- connector material located in a second aperture in the second carrier connected to the connector material in the at least one aperture in the first carrier.

36. The semiconductor device assembly of claim 33, wherein the first carrier includes a first frustoconical surface on a portion thereof, a second frustoconical surface on another portion thereof, and a lip on a portion of a bottom surface thereof.

37. An assembly comprising:
- a substrate having an upper surface, a lower surface, and at least one circuit on the upper surface thereof;
- a first carrier having a cavity therein, an upper surface, a lower surface, at least one connection pad on the upper surface, at least one connection pad on the lower surface, at least one first circuit connecting the at least one connection pad on the upper surface to the at least one connection pad on the lower surface, and at least one second circuit located in a portion of the cavity connected to one of the at least one connection pad on the upper surface and the at least one connection pad on the lower surface;
- a first semiconductor device having an active surface having at least one bond pad thereon, the first semiconductor device located within the cavity of the first carrier;
- a first connector between the at least one second circuit located in a portion of the cavity of the first carrier and the at least one bond pad on the active surface of the first semiconductor device;
- encapsulant material filling a portion of the cavity in the first carrier;
- at least one second connector connected to the at least one connection pad on the lower surface of the first carrier and the at least one first circuit on the upper surface of the substrate;
- a second carrier oriented with respect to the first carrier and positioned the same direction as the first carrier further having a cavity therein, an upper surface, a lower surface, at least one connection pad on the upper surface, at least one connection pad on the lower surface, at least one first circuit connecting the at least one connection pad on the upper surface to the at least one connection pad on the lower surface, and at least one second circuit located in a portion of the cavity connected to the at least one connection pad on the upper surface and the at least one connection pad on the lower surface;
- a second semiconductor device having an active surface having at least one bond pad thereon, the second semiconductor device located within the cavity of the second carrier;
- a second connector between the at least one second circuit located in a portion of the cavity of the second carrier and the at least one bond pad on the active surface of the second semiconductor device;
- encapsulant material filling a portion of the cavity in the second carrier;
- at least one third connector connected to the at least one connection pad on the lower surface of the second carrier and the at least one first circuit on the lower surface of the substrate.

38. The assembly of claim 37, wherein the first carrier includes at least one fin on a portion thereof.

39. The assembly of claim 37, further comprising:
   a third carrier oriented with respect to the first carrier and positioned the same direction as the first carrier further having a cavity therein, an upper surface, a lower surface, at least one connection pad on the upper surface, at least one connection pad on the lower surface, a first circuit connecting the at least one connection pad on the upper surface to the at least one connection pad on the lower surface, and at least one second circuit located in a portion of the cavity connected to the at least one connection pad on the upper surface and the at least one connection pad on the lower surface;
   a third semiconductor device having an active surface having at least one bond pad thereon, the third semiconductor device located within the cavity of the third carrier;
   a fourth connector between the at least one first circuit located in a portion of the cavity of the third carrier and the at least one bond pad on the active surface of the semiconductor device; and
   encapsulant material filling a portion of the cavity in the third carrier.

40. The assembly of claim 37, wherein the first carrier includes a first frustoconical surface on a portion thereof, a second frustoconical surface on another portion thereof, and a lip on a portion of a bottom surface thereof.

41. An assembly comprising:
   a substrate having an upper surface, a lower surface, and at least one circuit on the upper surface thereof;
   a first carrier having a cavity therein, an upper surface, a lower surface, at least one aperture extending therethrough, and the at least one circuit located in a portion of the cavity extending to the at least one aperture;
   a semiconductor device having an active surface having at least one bond pad thereon, the semiconductor device located within the cavity of the first carrier;
   a first connector between the at least one circuit located in a portion of the cavity of the first carrier and the at least one bond pad on the active surface of the semiconductor device;
   encapsulant material filling a portion of the cavity in the first carrier;
   a first connector material located in the at least one aperture in the carrier;
   at least one second connector connected to the first connector material in the at least one aperture in the first carrier and the at least one circuit on the upper surface of the substrate;
   a second carrier oriented with respect to the first carrier and positioned the same direction as the first carrier further having a cavity therein, an upper surface, a lower surface, at least one connection pad on the upper surface, at least one connection pad on the lower surface, at least one first circuit connecting the at least one connection pad on the upper surface to the at least one connection pad on the lower surface, and at least one second circuit located in a portion of the cavity connected to the at least one connection pad on the upper surface and the at least one connection pad on the lower surface;
   a second semiconductor device having an active surface having at least one bond pad thereon, the second semiconductor device located within the cavity of the second carrier;
   a second connector between the at least one second circuit located in a portion of the cavity of the second carrier and the at least one bond pad on the active surface of the second semiconductor device;
   encapsulant material filling a portion of the cavity in the second carrier;
   at least one third connector connected to the at least one connection pad on the lower surface of the second carrier and the at least one first circuit on the lower surface of the substrate.

42. The assembly of claim 41, wherein the first carrier includes at least one fin on a portion thereof.

43. The assembly of claim 41, further comprising:
   a third carrier oriented with respect to the first carrier and positioned the same direction as the first carrier further having a cavity therein, an upper surface, a lower surface, at least one connection pad on the upper surface, at least one connection pad on the lower surface, at least one first circuit connecting the at least one connection pad on the upper surface to the at least one connection pad on the lower surface, and at least one second circuit located in a portion of the cavity connected to the at least one connection pad on the upper surface and the at least one connection pad on the lower surface;
   a third semiconductor device having an active surface having at least one bond pad thereon, the third semiconductor device located within the cavity of the third carrier;
   a fourth connector between the at least one second circuit located in a portion of the cavity of the third carrier and the at least one bond pad on the active surface of the third semiconductor device; and
   encapsulant material filling a portion of the cavity in the third carrier.

44. An semiconductor device assembly comprising:
   a substrate having an upper surface, a lower surface, and at least one circuit on the upper surface thereof;
   a first carrier having a cavity therein, an upper surface, a lower surface, at least one aperture extending therethrough, and the at least one circuit located in a portion of the cavity extending to the at least one aperture;
   a semiconductor device having an active surface having at least one bond pad thereon, the semiconductor device located within the cavity of the first carrier;
   a first connector between the at least one circuit located in a portion of the cavity of the first carrier and the at least one bond pad on the active surface of the semiconductor device;
   encapsulant material filling a portion of the cavity in the first carrier;
   a first connector material located in the at least one aperture in the first carrier;
   at least one second connector connected to the first connector material located in the at least one aperture in the first carrier and the at least one circuit on the upper surface of the substrate;
   a second carrier oriented with respect to the first carrier and positioned the same direction as the first carrier further having a cavity therein, an upper surface, a lower surface, at least one connection pad on the upper surface, at least one connection pad on the lower surface, at least one first circuit connecting the at least one connection pad on the upper surface to the at least one connection pad on the lower surface, and at least one second circuit located in a portion of the cavity connected to the at least one connection pad on the upper surface and the at least one connection pad on the lower surface;

a second semiconductor device having an active surface having at least one bond pad thereon, the second semiconductor device located within the cavity of the second carrier;

a second connector between the at least one second circuit located in a portion of the cavity of the second carrier and the at least one bond pad on the active surface of the second semiconductor device;

encapsulant material filling a portion of the cavity in the second carrier;

at least one third connector connected to the at least one connection pad on the lower surface of the second carrier and the at least one first circuit on the lower surface of the substrate.

45. The assembly of claim 44, wherein the first carrier includes at least one fin on a portion thereof.

46. The assembly of claim 44, further comprising:

a third carrier oriented with respect to the first carrier and positioned the same direction as the first carrier further having a cavity therein, an upper surface, a lower surface, at least one connection pad on the upper surface, at least one connection pad on the lower surface, a first circuit connecting the at least one connection pad on the upper surface to the at least one connection pad on the lower surface, and at least one second circuit located in a portion of the cavity connected to the at least one connection pad on the upper surface and the at least one connection pad on the lower surface;

a third semiconductor device having an active surface having at least one bond pad thereon, the third semiconductor device located within the cavity of the third carrier;

a fourth connector between the at least one first circuit located in a portion of the cavity of the third carrier and the at least one bond pad on the active surface of the third semiconductor device; and encapsulant material filling a portion of the cavity in the third carrier.

\* \* \* \* \*

UNITED STATES PATENT AND TRADEMARK OFFICE
CERTIFICATE OF CORRECTION

PATENT NO. : 6,297,548 B1
DATED : October 2, 2001
INVENTOR(S) : Walter L. Moden, David J. Corisis, Leonard E. Mess and Larry D. Kinsman It is certified that error appears in the above-identified patent and that said Letters Patent is hereby corrected as shown below:

Column 2,
Line 12, change "print" to -- printed --
Line 42, change "bond" to -- bonds --
Lines 48 and 48-49, change "frusticonical" to -- frustoconical --
Line 61, change "it" to -- 14 --

Column 3,
Line 29, change "112." to -- 12. --
Line 41, change "are" to -- is --

Column 8,
Line 8, after "the" and before "carrier" insert -- first --
Line 65, change "fm" to -- fin --

Column 10,
Line 25, delete "one of"

Signed and Sealed this

Sixth Day of May, 2003

JAMES E. ROGAN
*Director of the United States Patent and Trademark Office*